(12) United States Patent
Werner et al.

(10) Patent No.: US 8,377,820 B2
(45) Date of Patent: Feb. 19, 2013

(54) METHOD OF FORMING A METALLIZATION SYSTEM OF A SEMICONDUCTOR DEVICE BY USING A HARD MASK FOR DEFINING THE VIA SIZE

(75) Inventors: Thomas Werner, Moritzburg (DE); Kai Frohberg, Niederau (DE); Frank Feustel, Dresden (DE)

(73) Assignee: GlobalFoundries Inc., Grand Cayman (KY)

( * ) Notice: Subject to any disclaimer, the term of this patent is extended or adjusted under 35 U.S.C. 154(b) by 378 days.

(21) Appl. No.: 12/693,030

(22) Filed: Jan. 25, 2010

(65) Prior Publication Data

US 2010/0197133 A1 Aug. 5, 2010

(30) Foreign Application Priority Data

Jan. 30, 2009 (DE) .......................... 10 2009 006 798

(51) Int. Cl.
*H01L 21/4763* (2006.01)

(52) U.S. Cl. ........ 438/638; 438/637; 438/639; 438/640; 257/E21.215; 257/E21.586

(58) Field of Classification Search .................. 438/637, 438/638, 639, 640; 257/E21.577, E21.579
See application file for complete search history.

(56) References Cited

U.S. PATENT DOCUMENTS

| 6,365,506 B1 | 4/2002 | Chang et al. .................. 438/624 |
| 6,406,993 B1 | 6/2002 | Dakshina-Murthy et al. .............................. 438/624 |
| 2003/0003716 A1 | 1/2003 | Kim .............................. 438/638 |
| 2007/0105362 A1 | 5/2007 | Kim et al. ..................... 438/618 |

FOREIGN PATENT DOCUMENTS

DE 102005020132 A1 11/2006

OTHER PUBLICATIONS

Translation of Official Communication from German Patent Office for German Patent Application No. 10 2009 006 798.1-33 dated Dec. 7, 2009.
Translation of Official Communication from German Patent Office for German Patent Application No. 10 2009 006 798.1-33 dated Apr. 7, 2010.

*Primary Examiner* — Julio J Maldonado
*Assistant Examiner* — Amar Movva
(74) *Attorney, Agent, or Firm* — Williams, Morgan & Amerson, P.C.

(57) ABSTRACT

In a "via first/trench last" approach for forming metal lines and vias in a metallization system of a semiconductor device, a combination of two hard masks may be used, wherein the desired lateral size of the via openings may be defined on the basis of spacer elements, thereby resulting in significantly less demanding lithography conditions compared to conventional approaches.

24 Claims, 6 Drawing Sheets

METHOD OF FORMING A METALLIZATION SYSTEM OF A SEMICONDUCTOR DEVICE BY USING A HARD MASK FOR DEFINING THE VIA SIZE

BACKGROUND OF THE INVENTION

1. Field of the Invention

Generally, the present disclosure relates to microstructures, such as advanced integrated circuits, and, more particularly, to conductive structures, such as copper-based metallization layers, comprising wide metal lines connected to closely spaced narrow metal lines.

2. Description of the Related Art

In the fabrication of modern microstructures, such as integrated circuits, there is a continuous drive to steadily reduce the feature sizes of microstructure elements, thereby enhancing the functionality of these structures. For instance, in modern integrated circuits, minimum feature sizes, such as the channel length of field effect transistors, have reached the deep sub-micron range, thereby increasing performance of these circuits in terms of speed and/or power consumption and/or diversity of functions. As the size of individual circuit elements is reduced with every new circuit generation, thereby improving, for example, the switching speed of the transistor elements, the available floor space for interconnect lines electrically connecting the individual circuit elements is also decreased. Consequently, the dimensions of these interconnect lines are also reduced to compensate for a reduced amount of available floor space and for an increased number of circuit elements provided per unit die area as typically the number of interconnections required increases more rapidly than the number of circuit elements. Thus, a plurality of stacked "wiring" layers, also referred to as metallization layers, is usually provided, wherein individual metal lines of one metallization layer are connected to individual metal lines of an overlying or underlying metallization layer by so-called vias. Despite the provision of a plurality of metallization layers, reduced dimensions of the interconnect lines are necessary to comply with the enormous complexity of, for instance, modern CPUs, memory chips, ASICs (application specific ICs) and the like.

Advanced integrated circuits, including transistor elements having a critical dimension of 0.05 µm and even less, may, therefore, typically be operated at significantly increased current densities of up to several kA per cm$^2$ in the individual interconnect structures despite the provision of a relatively large number of metallization layers owing to the significant number of circuit elements per unit area. Consequently, well-established materials, such as aluminum, are being replaced by copper and copper alloys, a material with significantly lower electrical resistivity and improved resistance to electromigration even at considerably higher current densities compared to aluminum. The introduction of copper into the fabrication of microstructures and integrated circuits comes along with a plurality of severe problems residing in copper's characteristic to readily diffuse in silicon dioxide and a plurality of low-k dielectric materials, which are typically used in combination with copper in order to reduce the parasitic capacitance within complex metallization layers. In order to provide the necessary adhesion and to avoid the undesired diffusion of copper atoms into sensitive device regions, it is, therefore, usually necessary to provide a barrier layer between the copper and the dielectric material in which the copper-based interconnect structures are embedded. Although silicon nitride is a dielectric material that effectively prevents the diffusion of copper atoms, selecting silicon nitride as an interlayer dielectric material is less than desirable, since silicon nitride exhibits a moderately high permittivity, thereby increasing the parasitic capacitance of neighboring copper lines, which may result in non-tolerable signal propagation delays. Hence, a thin conductive barrier layer that also imparts the required mechanical stability to the copper is usually formed so as to separate the bulk copper from the surrounding dielectric material, thereby reducing copper diffusion into the dielectric materials and also reducing the diffusion of unwanted species, such as oxygen, fluorine and the like, into the copper. Furthermore, the conductive barrier layers may also provide highly stable interfaces with the copper, thereby reducing the probability for significant material transport at the interface, which is typically a critical region in view of increased diffusion paths that may facilitate current induced material diffusion. Currently, tantalum, titanium, tungsten and their compounds with nitrogen and silicon and the like are preferred candidates for a conductive barrier layer, wherein the barrier layer may comprise two or more sub-layers of different composition so as to meet the requirements in terms of diffusion suppressing and adhesion properties.

Another characteristic of copper significantly distinguishing it from aluminum is the fact that copper may not be readily deposited in larger amounts by chemical and physical vapor deposition techniques, thereby requiring a process strategy that is commonly referred to as the damascene or inlaid technique. In the damascene process, first a dielectric layer is formed which is then patterned to include trenches and/or vias which are subsequently filled with copper, wherein, as previously noted, prior to filling in the copper, a conductive barrier layer is formed on sidewalls of the trenches and vias. The deposition of the bulk copper material into the trenches and vias is usually accomplished by wet chemical deposition processes, such as electroplating and electroless plating, thereby requiring the reliable filling of vias with an aspect ratio of 5 and more with a diameter of 0.3 µm or even less in combination with trenches having a width ranging from 0.1 µm to several µm. Electrochemical deposition processes for copper are well established in the field of electronic circuit board fabrication. However, for the dimensions of the metal regions in semiconductor devices, the void free filling of high aspect ratio vias is an extremely complex and challenging task, wherein the characteristics of the finally obtained copper-based interconnect structure significantly depend on process parameters, materials and geometry of the structure of interest. Since the basic geometry of interconnect structures is substantially determined by the design requirements and may, therefore, not be significantly altered for a given microstructure, it is of great importance to estimate and control the impact of materials, such as conductive and non-conductive barrier layers, of the copper microstructure and their mutual interaction on the characteristics of the interconnect structure so as to insure both high yield and the required product reliability.

In addition to achieving high production yield and superior reliability of the metallization system, it is also important to achieve a high level in production yield and reliability on the basis of a high overall throughput of the manufacturing process under consideration. For instance, the so-called dual damascene process is frequently used in which a via opening and a corresponding trench are filled in a common deposition sequence, thereby providing superior process efficiency.

In the damascene technique or inlaid technique, typically the patterning of the via opening and the trenches may require sophisticated lithography techniques since the shrinkage of critical dimensions in the device layer, i.e., for transistors and other semiconductor circuit elements, may also require a corresponding adaptation of the critical dimensions of the vias and metal lines to be formed in the metallization system. In some well-established process techniques, a patterning regime may be used, which may commonly be referred to as "via first/trench last" approach in which at least a portion of a via opening may be formed first on the basis of a specific etch mask and thereafter a corresponding trench mask may be provided in order to form a corresponding trench in the upper portion of the dielectric material, wherein, depending on the overall process strategy, during the trench etch process, the remaining portion of the via opening may also be completed, while, in other cases, the via opening may be provided such that it extends down to a bottom etch stop layer, which may then be opened after completing the trench etch process. Consequently, a complex patterning regime including at least two lithography steps may have to be used in which at least the lithography process for defining the lateral size of the via openings represents a highly critical process step, since the via openings may typically have critical dimensions in both lateral directions, requiring extremely sophisticated lithography tools and related process techniques. With shrinking critical dimensions, however, a precise definition of the lateral size of the via opening may become increasingly difficult, since, for instance, the thickness of sophisticated resist materials may have to be adapted to the reduced wavelength of sophisticated lithography tools, which may on the other hand restrict the etch resistivity of the resist mask. Furthermore, additional process steps may be required for planarizing the overall surface topography for forming the trench mask after etching at least a portion of the via opening into the dielectric material of the metallization layer under consideration. Consequently, many advantages in view of process efficiency of a dual damascene technique may be offset or even over-compensated for by the requirement for the very complex patterning regime, wherein, in particular, the precise definition of a required reduced target size of the via openings may necessitate extremely difficult and thus failure-prone lithography steps.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides techniques for forming metallization systems of advanced semiconductor devices in which an overall high efficiency of the manufacturing flow may be accomplished by filling via openings and trenches in a common deposition process, while, during the patterning of the via openings and the trenches, a reduced complexity and enhanced reliability may be accomplished. For this purpose, at least the patterning of the via openings may be accomplished on the basis of a hard mask material, which may be patterned in a further advanced manufacturing stage on the basis of an additional trench mask, which may be used, according to some illustrative embodiments disclosed herein, for patterning a final portion of the via opening and the trench in a common etch process. In some illustrative embodiments, a corresponding mask opening of the via etch mask may be formed on the basis of less critical constraints with respect to a lithography process, wherein, after lithographically patterning the etch mask, the final lateral target size of the mask opening may be defined on the basis of spacer elements, thereby significantly extending the applicability of well-established lithography techniques for sophisticated semiconductor devices requiring even further reduced lateral dimensions of vias. In some illustrative aspects disclosed herein, the spacer elements for the mask opening may be patterned so as to act as a mask for the trench opening, thereby further enhancing overall process efficiency.

One illustrative method disclosed herein comprises forming a first etch mask above a dielectric material of a metallization layer of a semiconductor device, wherein the first etch mask comprises a mask opening having a first lateral size. Furthermore, the method comprises forming a second etch mask above the first etch mask, wherein the second etch mask comprises a second mask opening aligned to the first mask opening and having a second lateral size that is greater than the first lateral size. The method further comprises forming a portion of a via opening on the basis of the first and second mask openings so as to extend to a first depth in the dielectric material. Additionally, the second mask opening is formed in the first etch mask by using the second etch mask as an etch template. Furthermore, a depth of the via opening is increased and a trench is formed in the dielectric material using the second mask opening as an etch mask.

A still further illustrative method disclosed herein comprises forming a first etch mask above a dielectric material of a metallization layer of a semiconductor device, wherein the etch mask comprises a first mask opening having a first lateral size. The method further comprises forming a spacer element on sidewalls of the first mask opening so as to adjust a lateral target size of a via opening. The method additionally comprises forming at least a portion of the via opening on the basis of the first mask opening having the lateral target size. Finally, the method comprises forming a trench in the dielectric material on the basis of a second etch mask so as to connect to the at least a portion of the via opening.

A still further illustrative method disclosed herein comprises forming a first etch mask above a dielectric material of a metallization layer of a semiconductor device wherein the first etch mask comprises a first mask opening. Moreover, a mask layer is formed above the first etch mask and in the first mask opening. Additionally, the method comprises patterning the mask layer on the basis of a trench mask so as to form a spacer element in the first mask opening and also to form a second etch mask from the mask layer that comprises a second mask opening in the mask layer. Finally, the method comprises forming a via opening and a trench connected thereto on the basis of the first mask opening comprising the spacer element and on the basis of the second mask opening.

BRIEF DESCRIPTION OF THE DRAWINGS

The disclosure may be understood by reference to the following description taken in conjunction with the accompanying drawings, in which like reference numerals identify like elements, and in which.

Figure 1A:
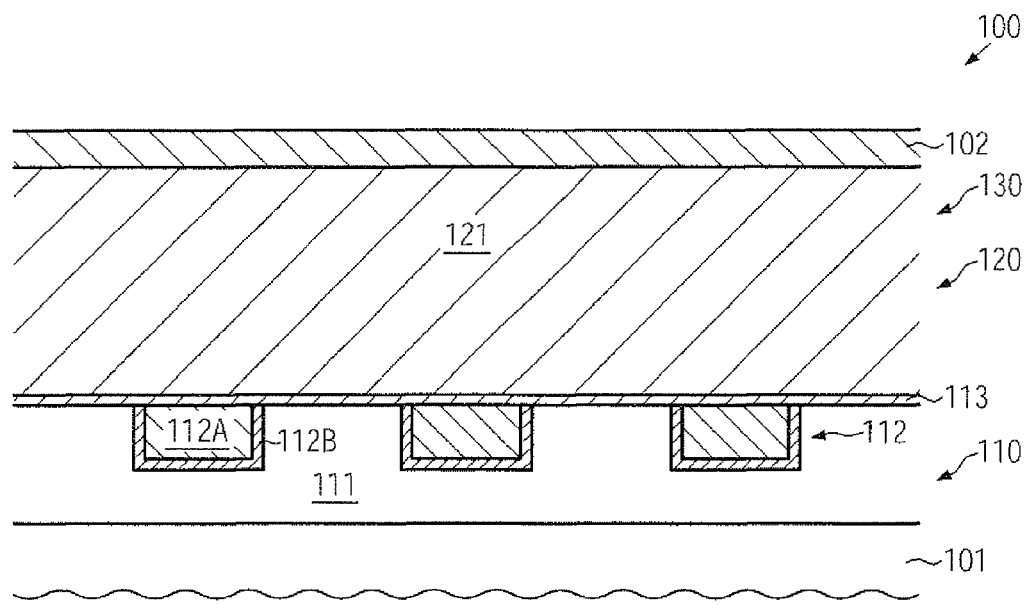
FIGS. 1*a*-1*j* schematically illustrate cross-sectional views of a semiconductor device during various manufacturing stages in forming a metallization system on the basis of an efficient "via first/trench last" approach, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides techniques for forming metallization systems of complex semiconductor devices on the basis of an efficient manufacturing sequence in which at least a portion of a via opening may be patterned first, followed by the patterning of a trench opening, which may then be commonly filled with an appropriate metal-containing material. During the patterning sequence, any restrictions of lithography processes, in particular for patterning a via mask, may be significantly relaxed by using a hard mask, thereby enabling a moderately thin resist material, wherein, additionally, in some illustrative embodiments, the lateral size of the mask opening may be defined on the basis of a spacer element, thereby "reducing" the critical dimension in the metallization level under consideration for given lithography capabilities. Consequently, well-established lithography techniques and tools may be used with an enhanced degree of reliability, while also providing the possibility of extending applicability of existing lithography techniques. In some illustrative embodiments, the spacer material used for forming the spacer elements within a corresponding mask opening for vias obtained on the basis of less critical lithography techniques may additionally be used as a further mask material of a trench mask, which may be patterned during an etch process for forming the spacer elements in the previously formed via mask opening. Consequently, the via opening and the trench opening may be defined on the basis of enhanced process conditions with respect to the lithography process, wherein at the same time the critical lateral size of the via may finally be determined by a deposition process, thereby further contributing to the enhanced overall reliability of the manufacturing sequence. Furthermore, in some illustrative embodiments, additional complex planarization steps, for instance for filling a previously formed via or a portion thereof and the like may be omitted, or may be performed with less critical process parameters, thereby even further contributing to an overall enhanced patterning regime.

It should be appreciated that the principles disclosed herein may thus be highly advantageously applied to sophisticated semiconductor devices in which transistor elements having a critical size for some components, such as a gate length of 50 nm and less, may also require a corresponding adaptation of the critical dimensions in the metallization system, which may be approximately 100 nm and less in specific metallization levels since, as previously explained, available lithography techniques may be used while nevertheless providing reduced critical dimensions without contributing to additional process complexity. On the other hand, the principles disclosed herein may also be applied to less critical semiconductor devices, since in this case superior device performance may be accomplished while at the same time increasing overall production yield due to less critical process margins during the critical patterning regime for providing vias and metal lines on the basis of a dual damascene technique. Thus, unless specifically set forth in the specification or the appended claims, the present disclosure should not be considered as being restricted to specific semiconductor devices.

FIG. 1a schematically illustrates a cross-sectional view of a semiconductor device 100 at a manufacturing stage in which a complex metallization system 130 is to be formed above a substrate 101. It should be appreciated that the substrate 101 may comprise a plurality of circuit elements, such as transistors and the like, which may be formed on the basis of design dimensions of approximately 50 nm and less, if sophisticated applications are considered. For instance, the gate length of sophisticated planar field effect transistors may be in the range of 50 nm and less, such as 30 nm and less, which may thus require corresponding high packing density in the metallization system 130, thereby also requiring reduced lateral dimensions for any metal features to be formed therein. For convenience, any such circuit elements are not shown in FIG. 1a. The metallization system 130 may comprise a metallization layer 110, or any device level of the semiconductor device 100, to which respective vertical contacts may have to be formed within a further metallization layer 120. The layer 110, for instance provided in the form of a metallization layer, may comprise a dielectric material 111, which may include a low-k dielectric material in order to reduce the parasitic capacitance between metal lines 112 which, at least in the portion illustrated in FIG. 1a, may represent "closely spaced" metal lines, as may be required by the overall circuit layout. For instance, the metal lines 112 may have a width of approximately 100 nm and less, and thus also the distance between an adjacent two of the metal lines 112 may be of a similar order of magnitude. As previously discussed, the metal lines may be formed on the basis of any appropriate highly conductive metal, such as copper, copper alloys, silver and the like, possibly in combination with a conductive barrier material 112B, which may provide the required metal confinement and the electromigration behavior, as explained above. Furthermore, a dielectric cap layer or etch stop layer 113 may typically be provided on the dielectric material 111 and the metal lines 112, wherein the cap layer 113 may, depending on the overall process strategy, also provide metal confinement and superior interface characteristics of the metal lines 112. In other cases, the metal lines 112 may comprise a conductive cap material, for instance any appropriate metal or metal alloy which may efficiently confine the copper material in the lines 112 and which may also provide a desired electromigration behavior.

With respect to any manufacturing techniques for forming the metallization layer 110, it may be referred to the metallization layer 120 which, in the manufacturing stage shown, may comprise a dielectric material 121, which may represent any appropriate material such as a low-k dielectric material, an ultra low-k (ULK) material, which may be understood as a dielectric material having a dielectric constant of 2.7 and less. In less critical device levels of the metallization system 130, i.e., in device levels in which the capacitance may be less relevant, the dielectric material 121 may also comprise other dielectrics, such as silicon dioxide and the like. It should be appreciated that the dielectric material 121 may also comprise any appropriate surface layer and the like in order to enhance the overall mechanical stability, since, in particular, sensitive low-k dielectric materials or ULK materials may suffer from a significantly increased fragility compared to conventional dielectric materials. Thus, if required, a surface area of the material 121 may comprise an appropriate material composition, for instance formed by deposition or surface treatment, as may be required for the further processing of the device 100. For convenience, any such material is not illustrated in FIG. 1a. As illustrated, the device 100 may further comprise a mask layer 102, that is, a material layer having an appropriate thickness and material composition so as to act as an etch stop material during the patterning of a via and/or a trench in the dielectric material 121. For example, the mask layer 102 may be comprised of silicon dioxide, silicon nitride, silicon oxynitride and the like. For instance, the mask layer 102 may also act as an anti-reflective coating (ARC) layer during a subsequent lithography process for forming a resist mask that may be used for pattering the mask layer 102. For example, the thickness of the layer 102 in combination with the optical characteristics, i.e., the index of refraction and the extinction coefficient, may be appropriately selected so as to reduce back reflection for a given exposure wavelength, while at the same time providing a desired etch stop capability.

The semiconductor device 100 as illustrated in FIG. 1a may be formed on the basis of well-established process techniques for forming any circuit elements in and above the substrate 101. Thereafter, an appropriate interface between the device level and the metallization system 130 may be provided, for instance in the form of a contact structure and the like, for which any appropriate manufacturing technique and configuration may be applied. Next, the metallization layer 110 may be formed, for instance on the basis of similar process techniques as will be described with reference to the metallization layer 120, when corresponding vias (not shown) are to be formed in the metallization layer 110 so as to connect to a lower lying device level. After completing the metallization layer 110, i.e., after depositing the cap or etch stop layer 113, which may be comprised of any appropriate material, such as silicon nitride, silicon carbide, nitrogen-containing silicon carbide and the like, the dielectric material 121 may be deposited, for instance by chemical vapor deposition (CVD) techniques, spin-on techniques and the like, wherein appropriate process steps may also be included in order to adjust the finally desired permittivity of the material 121. Next, the mask layer 102 may be formed, for instance by thermally activated CVD, plasma assisted CVD and the like.

Figure 1B:
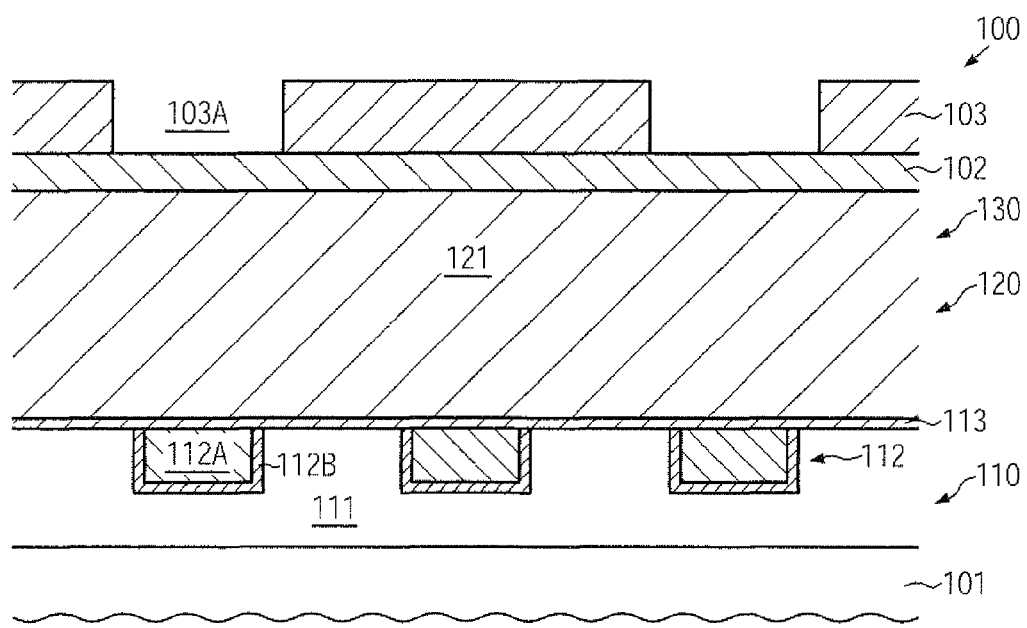

FIG. 1b schematically illustrates the semiconductor device 100 in a further advanced manufacturing stage in which an etch mask, such as a resist mask 103, may be formed above the mask layer 102 and may have openings 103A that may define the lateral position and general size of via openings to be formed in the dielectric material 121. The mask 103 may be formed on the basis of lithography techniques based on recipes for defining the lateral size of the openings 103A wherein, as previously explained, the lateral size of the openings 103A may be greater compared to a target lateral size of the via openings to be formed in the material 121. Consequently, the patterning of the mask 103 may be accomplished on the basis of less critical lithography conditions for desired final target size of corresponding via openings, wherein, additionally, a thickness of the mask 103 may be selected so as to enable a reliable patterning of the mask layer 102, which may be accomplished on the basis of a moderately reduced etch time compared to the patterning of the material 121. After providing the mask 103, an appropriate anisotropic etch process may be performed in order to remove material of the layer 102, which may be accomplished on the basis of a plurality of etch chemistries. For example, appropriate etch chemistries on the basis of fluorine and/or chlorine for removing silicon dioxide, silicon nitride, silicon carbide and the like are available and may be used for patterning the layer 102.

Figure 1C:
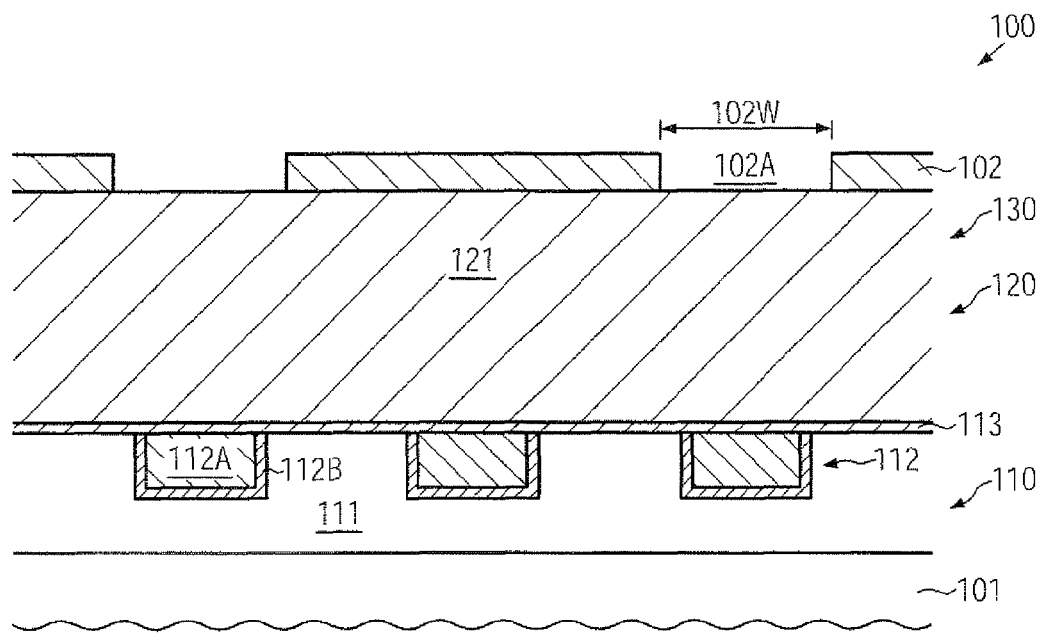

FIG. 1c schematically illustrates the semiconductor device 100 after completing the above-described process sequence. Hence, the mask layer 102 may comprise respective openings 102A having a lateral size 102W, which may substantially correspond to the lateral size of the openings 103A (FIG. 1b). Thus, the mask layer 102 in combination with the mask openings 102A may represent an etch mask, which may basically define the lateral position of the corresponding via openings still to be formed, while the lateral size 102W may be adjusted to the desired target value in a later manufacturing stage. It should be appreciated that, for convenience, the etch mask including the patterned mask layer 102 may also be referred to as etch mask 102.

Figure 1D:
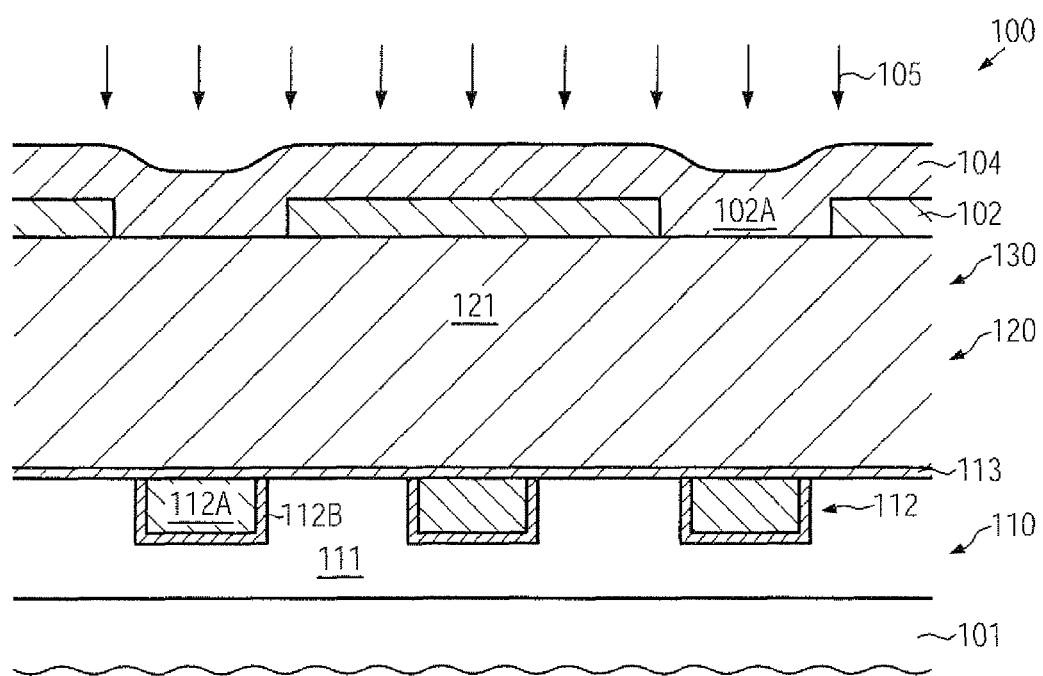

FIG. 1d schematically illustrates the semiconductor device 100 in a further advanced manufacturing stage. As illustrated, a spacer layer 104 which, in some illustrative embodiments, may also act as a further mask layer, may be formed above the etch mask 102 and may also be formed within the openings 102A. The spacer layer 104 may be comprised of any appropriate material, such as silicon dioxide, silicon nitride, silicon oxynitride and the like. For example, in some illustrative embodiments, the spacer layer 104 may be comprised of a material having a similar etch behavior during a subsequent patterning process compared to the etch mask 102, which may, for instance, be accomplished by using a similar material composition, if desired. Moreover, a thickness of the material 104 may be selected such that a desired etch resistivity may be achieved during the further processing so as to enable further patterning of the etch mask 102 in an advanced manufacturing stage. For this purpose, parameters of a deposition process 105, such as a thermally activated CVD process, if the corresponding process temperatures are compatible with the manufacturing stage of the device 100, may be applied so as to obtain the desired material composition and thickness. For instance, a thickness in the range of 30-80 nm may be used for the layer 104, while a thickness in the same range may also be used for the etch mask 102.

Figure 1E:
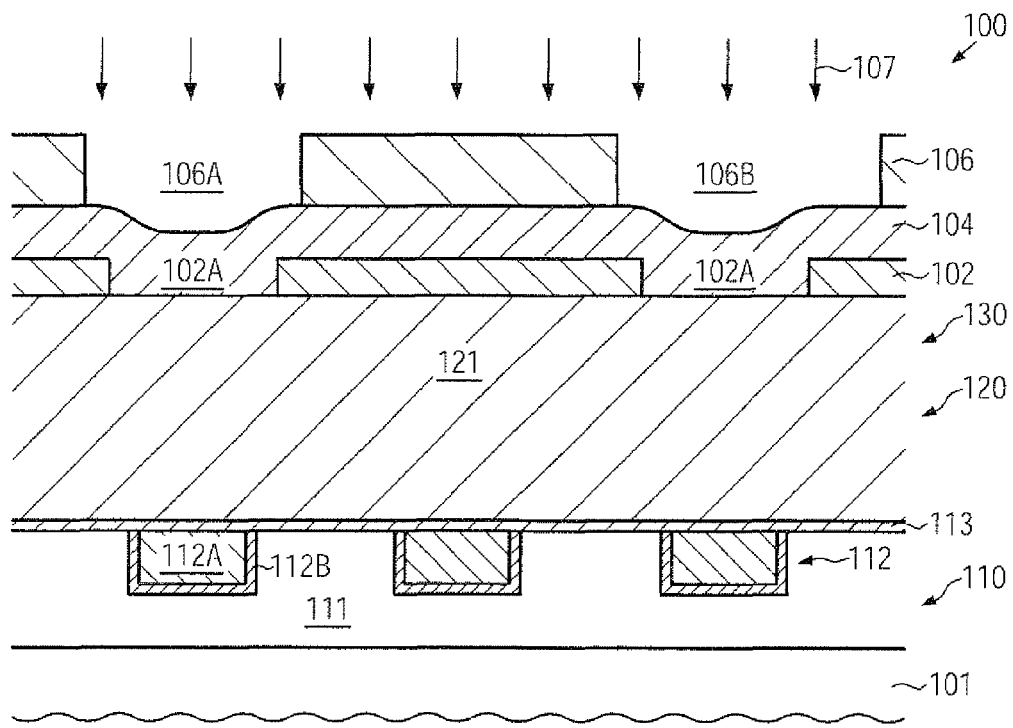

FIG. 1e schematically illustrates the semiconductor device 100 in a further advanced manufacturing stage in which a further mask 106, such as a resist mask, may be provided in order to define the lateral position and size of corresponding metal lines to be formed in the dielectric material 121. As illustrated, the mask 106 may comprise respective trench openings 106A, 106B, each of which may be aligned to one of the mask openings 102A of the etch mask 102. With respect to forming the resist mask 106, similar criteria may apply as previously explained, wherein, also in this case, less restrictive process conditions may be applied since, for instance, the thickness of the resist material of the mask 106 may have to be adapted to etch conditions required for patterning the spacer layer 104, thereby enabling an overall reduced thickness of the resist material, which may thus enhance the optical response of the resist material due to sophisticated lithography processes performed on the basis of reduced exposure wavelength. It should be appreciated that, during the corresponding lithography process, the spacer layer 104 may also act as an ARC material, if desired. Next, the device 100 may be exposed to an etch ambient 107 that may be appropriately established so as to anisotropically remove material of the spacer layer 104. It should be appreciated that, during the preceding patterning sequence and also during the etch process 107, generally the dielectric material 121 may have a significantly higher etch rate compared to the materials of the layers 102 and 104, thereby avoiding significant material erosion upon exposure to the corresponding etch ambient. For example, dielectric material 121 may have formed thereon an appropriate cap material, as previously discussed, which may provide a corresponding etch resistivity. In other cases, the dielectric material of the layer 121 itself may provide a moderately high degree of etch selectivity since, for instance, a plurality of low-k dielectric materials may have a significantly reduced etch rate in corresponding etch chemistries that may be applied for etching well-established dielectric materials, such as silicon dioxide, silicon nitride and the like.

Thus, upon removing the exposed portion of the layer 104, the surface topography during the preceding deposition of the layer 104 may result in the exposure of a portion of the material 121 within the openings 102A, while nevertheless maintaining corresponding spacer elements at sidewalls of the openings 102A.

Figure 1F:
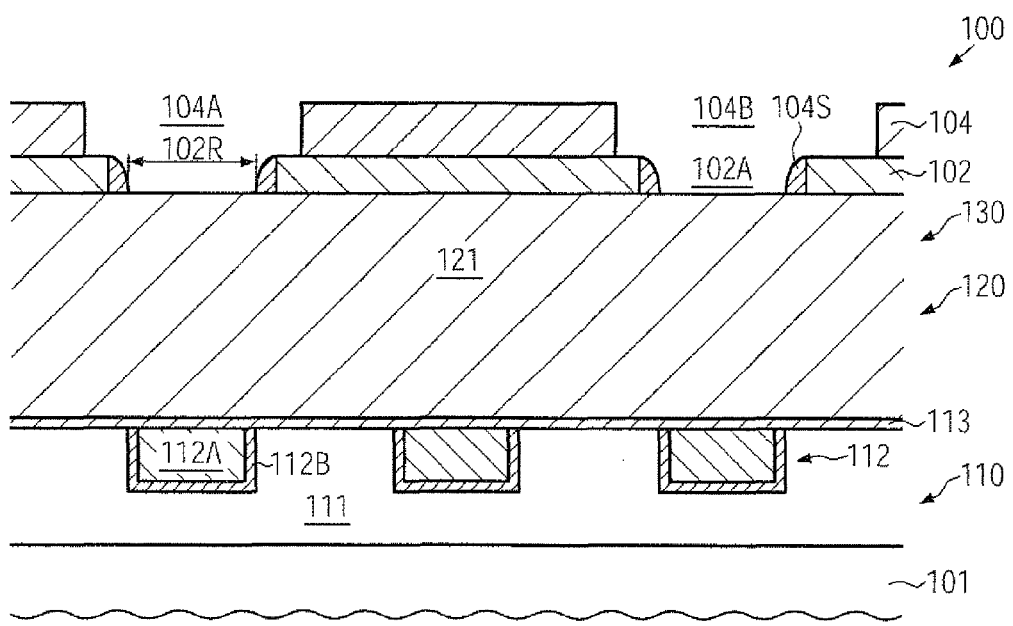

FIG. 1f schematically illustrates the semiconductor device 100 after the above-described process sequence and the removal of the resist mask 106 of FIG. 1e. As illustrated, the patterned spacer layer 104 may now comprise corresponding openings 104A, 104B, thereby forming a further etch mask, which may also be referred to as an etch mask 104. Furthermore, the material residues of the spacer layer 104 within the openings 102A may form corresponding spacer elements 104S, thereby defining a reduced lateral size 102R of the mask openings 102A. The width of the spacer elements 104S may typically be defined on the basis of a thickness of the initial spacer layer 104 (FIG. 1e) and the corresponding parameters of the etch process 107 (FIG. 1e). Consequently, the reduced width 102R may be efficiently adjusted in accordance with a desired lateral target size of via openings still to be formed in the dielectric material 121.

Figure 1G:
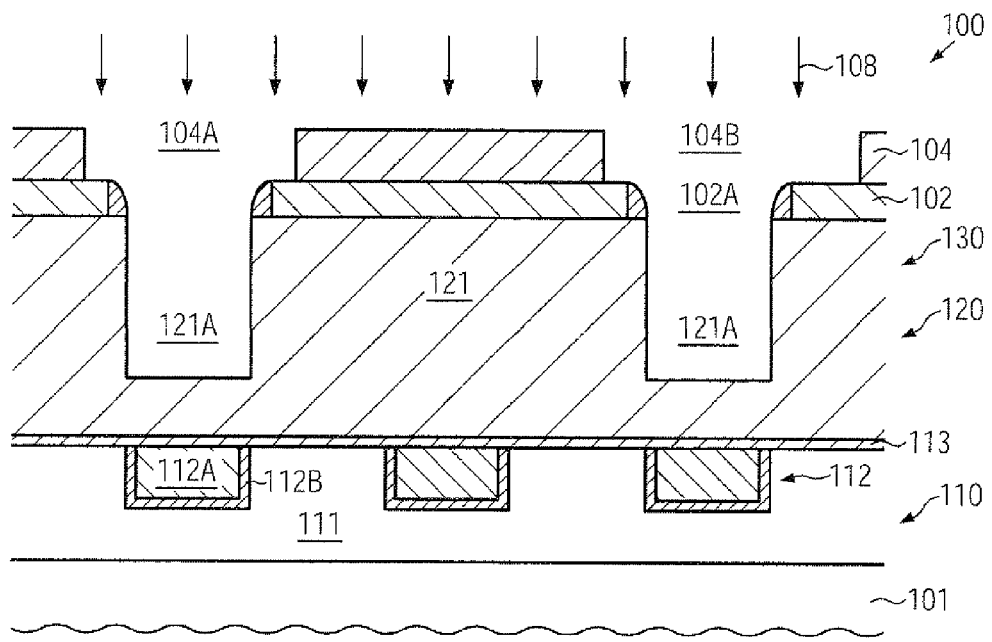

FIG. 1g schematically illustrates the semiconductor device 100 when exposed to an anisotropic etch ambient 108 designed to remove material of the layer 121 selectively to the etch masks 104 and 102. For this purpose, well-established etch recipes may be used on the basis of etch techniques as may also be used in conventional techniques. Consequently, during the anisotropic etch process 108, the reduced lateral size 102R (FIG. 1f) may represent the actual mask opening for forming at least a first portion 121A of a via opening in the dielectric material 121. That is, the portion 121A may be formed by means of the mask openings 102A, 104A, while the etch mask 102 may reliably protect the material 121 outside of the opening 102A within the opening 104A, which may represent a trench of a metal line and which may thus have significantly increased dimensions, at least in one lateral direction. In one illustrative embodiment, the etch process 108 may be performed in such a manner that a portion of the via opening 121A may terminate within the dielectric material 121, substantially without extending to the etch stop layer 113. In this case, the deepening of the portion 121A may be accomplished during a later manufacturing stage in which corresponding trenches may also be formed in an upper portion of the dielectric material 121. In other illustrative embodiments (not shown), the opening 121A may be formed so as to extend down to the etch stop layer 113, the etch stop capabilities thereof are sufficient so as to avoid undue material removal of any of the metal lines 112 during the subsequent further patterning of the dielectric material 121.

Figure 1H:
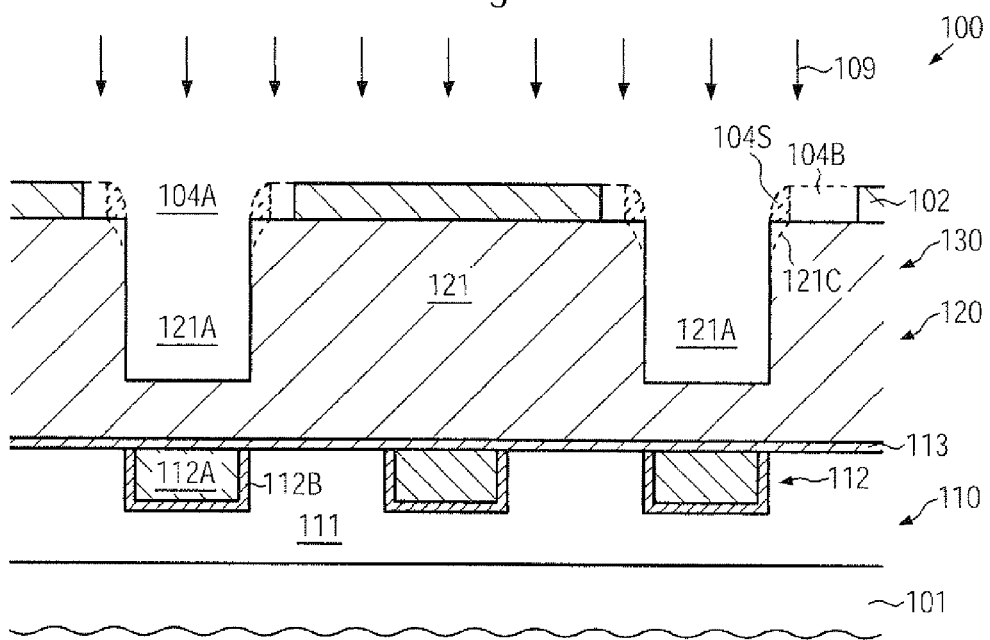

FIG. 1h schematically illustrates the semiconductor device 100 when exposed to a further etch process 109, which may be designed to "transfer" the trench openings 104A, 104B into the etch mask 102. For instance, the etch process 109 may represent an anisotropic etch recipe, which may be performed on the basis of an etch chemistry that provides a similar etch rate of the materials of the etch masks 104, 102 (see FIG. 1g). In this case, the material of the etch mask 104 and of the exposed portion of the etch mask 102, that is, material within the mask openings 104A, 104B of the etch mask 102, may be removed wherein the combined thickness of the etch masks 102 and 104 outside the trench openings 104A, 104B may thus provide a sufficient thickness of the etch mask 102. In this manner, the etch mask 102 may now "comprise" the mask openings 104A, 104B and may thus be used as a further etch mask for forming trenches in the dielectric material 121. Consequently, during the etch process 109, the etch mask 104 may be used as a template for patterning the etch mask 102. It should be appreciated that, due to the very similar etch behavior, which may be accomplished, for instance, by using a very similar material composition for the etch masks 102 and 104, the spacer elements 104S may be reliably removed, wherein the corresponding rounding of the spacer elements may also be "transferred" into the material 121, as indicated by 121C. A corresponding rounding effect may be even further enhanced by applying a certain degree of "over-etching," as long as the thickness of the remaining etch mask 102 may provide a sufficient etch resistivity during the subsequent processing of the device 100.

Figure 1I:
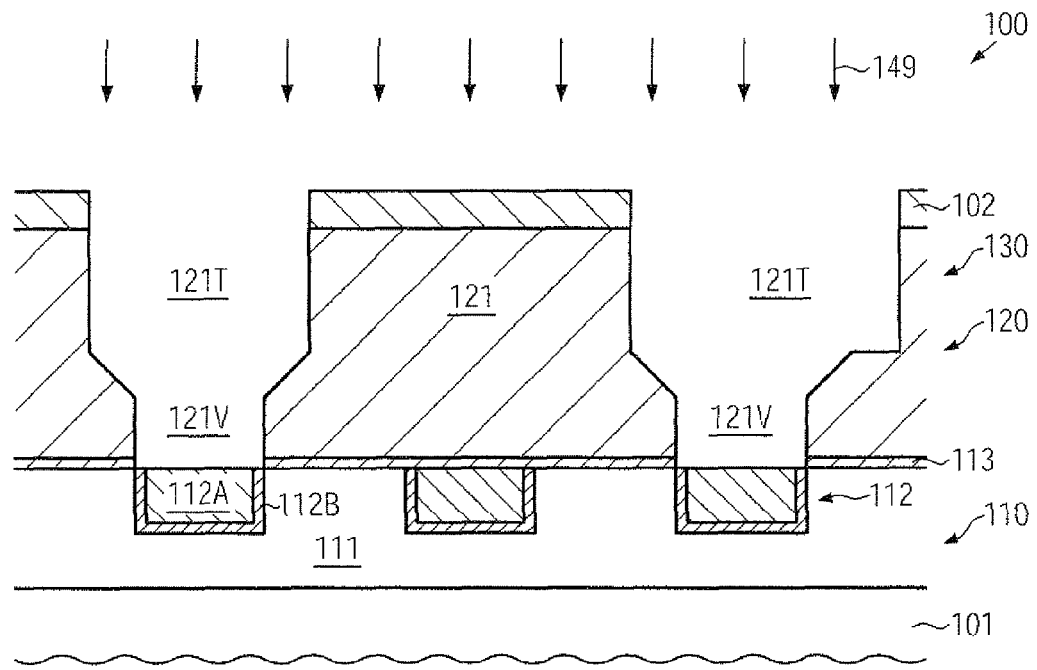

FIG. 1i schematically illustrates the semiconductor device 100 when exposed to a further anisotropic etch ambient 149 that may be established on the basis of an appropriate selective etch chemistry for removing material of the layer 121 selectively to the etch mask 102. Consequently, during the etch process 149, corresponding trenches 121T may be formed, wherein the lateral size may be determined by the corresponding mask openings 104A, 104B (FIG. 1h), wherein a corresponding depth of the trenches 121T may be adjusted on the basis of the etch time for a given recipe of the process 149. Furthermore, the depth of the previously formed portions 121A (FIG. 1h) may be increased so as to extend down to the etch stop layer 113, thereby forming via openings 121V having a lateral dimension that may be substantially determined by the lateral size 102R defined by the spacer elements 104S as explained with reference to FIG. 1f. Furthermore, due to the preceding etch process 109, which may result in a pronounced degree of tapering 121C (see FIG. 1h), the corresponding corner rounding may also be transferred and may be even further increased, thereby obtaining the pronounced tapering connecting the trenches 121T with the respective via openings 121V, which may be advantageous during the subsequent processing for filling in an appropriate material. During the etch sequence 149 or during a corresponding separate etch step, the etch stop material 113 may be opened so as to connect the via openings 121V to the underlying metal regions 112.

Figure 1J:
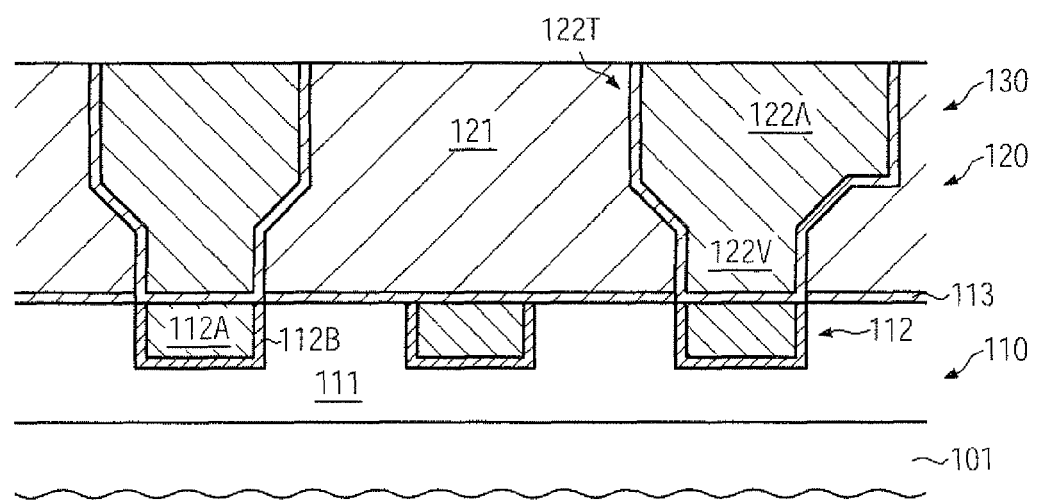

FIG. 1*j* schematically illustrates the semiconductor device 100 in a further advanced manufacturing stage in which metal lines 122T and vias 122V connected thereto may be provided on the basis of the trenches 121T and the via openings 121V, as shown in FIG. 1*i*. For this purpose, well-established deposition strategies may be used, for instance, for depositing a conductive barrier material 122A into the trenches 121T and the associated via 121V of FIG. 1*i*, for instance by sputter deposition, CVD, atomic layer deposition (ALD), electrochemical deposition and the like. Depending on the overall process strategy, a seed material may be deposited while, in other cases, a highly conductive metal, such as copper and the like, may be deposited directly on the conductive barrier material 122A. For this purpose, electrochemical deposition techniques, i.e., electroplating and/or electroless plating, may be applied on the basis of appropriate process recipes. After the deposition of materials 122A, any excess material may be removed by any appropriate planarization technique, such as electrochemical etching, electropolishing, chemical mechanical polishing (CMP) and the like. During the corresponding removal process, residues of the etch mask 102 (FIG. 1*i*) may be removed, while in other cases the etch mask 102 may be removed prior to the deposition of the material 122A. Thereafter, any appropriate cap material for the trenches 122T may be deposited or otherwise formed, for instance providing conductive cap materials by selective deposition techniques and the like. In addition to or alternatively to a conductive cap material, a further etch stop material, similar to the etch stop layer 113, may be formed above the dielectric material 121 and the metal lines 122T, thereby completing the metallization layer 120. Thereafter, one or more additional metallization layers may be formed above the metallization layer 120, depending on the overall complexity of the semiconductor device 100.

Figure 1K:
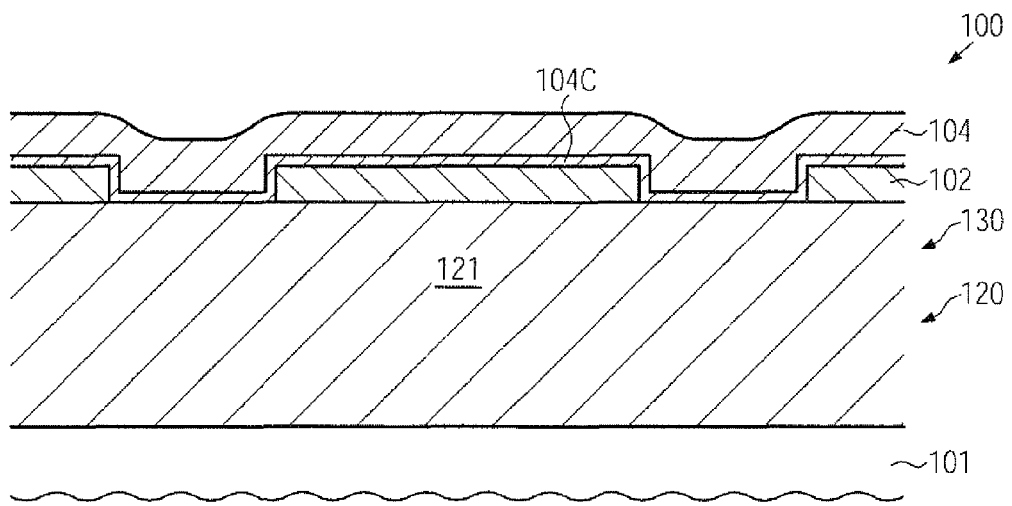
FIGS. 1*k*-1*l* schematically illustrate cross-sectional views of the semiconductor device according to further illustrative embodiments in which the patterning of corresponding etch masks may be enhanced by using an additional thin etch stop material.

FIG. 1*k* schematically illustrates the semiconductor device 100 according to further illustrative embodiments in which an additional etch stop liner may be used for further enhancing overall process reliability. As illustrated, an etch stop liner 104C may be formed between the etch mask 102 and the spacer layer 104. For example, the etch mask 102 and the spacer layer 104 may be comprised of substantially the same material, for instance, silicon oxynitride, silicon dioxide, silicon nitride and the like, while the etch stop liner 104C may be provided in the form of different material composition having a significantly different etch behavior compared to the materials 104 and 102. For instance, silicon nitride may be efficiently used in combination with silicon dioxide and silicon oxynitride and the like. The etch stop liner 104C may be deposited on the basis of plasma assisted etch recipes with a thickness of several nanometers to approximately 10 nanometers, followed by the deposition of the spacer layer 104.

Figure 1L:
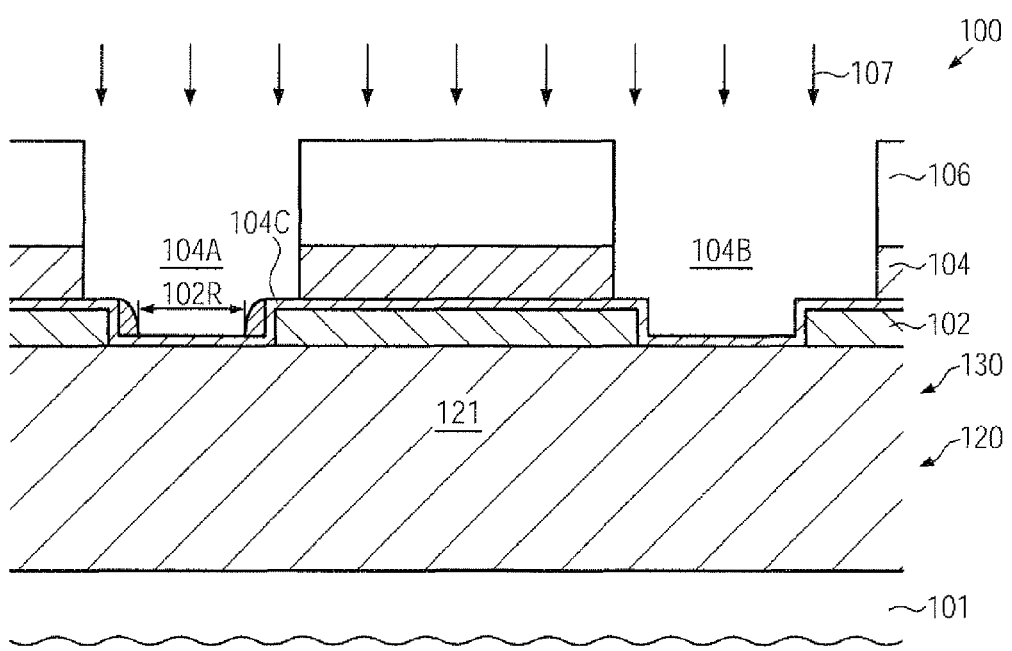

FIG. 1*l* schematically illustrates the semiconductor device 100 during the etch process 107 performed on the basis of the resist mask 106 for patterning the spacer layer 104. During the etch process 107, integrity of the etch mask 102 may be enhanced due to the etch stop capabilities of the liner 104C, wherein undue removal of material of the layer 121 may also be avoided, thereby providing enhanced process conditions during the further patterning of the material 121. That is, well-defined start conditions may be obtained for the further patterning of the material 121 irrespective of the characteristics of the etch process 107. Furthermore, the etch process 107 may be appropriately adjusted in order to obtain a desired width of the spacer elements 104, for instance by appropriately selecting any over-etch time, which may have an influence on the finally obtained width. Consequently, increased flexibility in adjusting the lateral size 102R may be obtained without compromising the etch mask 102. After the etch process 107, the resist mask 106 may be removed and exposed portions of the etch stop liner 104C may be removed to expose the material 121, which may be accomplished by well-established selective wet chemical etch recipes. Consequently, portions of the etch mask 102 within the trench openings 104A, 104B may also be exposed during a corresponding etch step. Thereafter, the further processing may be continued by etching into the material 121 on the basis of the etch mask 102, as previously described. Thereafter, the etch mask 102 may be patterned on the basis of the mask 104, wherein enhanced integrity of the mask 102 may also be accomplished since the etch stop liner 104C outside the trench openings 104A, 104B may reliably stop the corresponding material removal so that a defined thickness of the etch mask 102 may be obtained for the final patterning process for forming the trenches and via openings, as previously explained.

As a result, the present disclosure provides techniques for patterning a dielectric material of a metallization system by using a via first/trench last approach, wherein constraints with respect to sophisticated lithography techniques may be less critical and the overall process sequence may exhibit reduced complexity compared to conventional approaches. Furthermore, the target lateral size of via openings may be defined on the basis of a spacer element, thereby significantly extending the patterning capabilities of well-established lithography recipes. Consequently, sophisticated semiconductor devices including closely spaced vias and metal lines with lateral dimensions of approximately 100 nm and less may be formed with reduced complexity and enhanced performance and reliability.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a first etch mask above a dielectric material of a metallization layer of a semiconductor device, said first etch mask comprising a mask opening having a first lateral size;
    forming an etch stop layer above said first etch mask;
    forming a second etch mask above said etch stop layer, said second etch mask comprising a second mask opening aligned to said first mask opening and having a second lateral size that is greater than said first lateral size;
    forming a portion of a via opening on the basis of said first and second mask openings so as to extend to a first depth in said dielectric material;

forming said second mask opening in said first etch mask by using said second etch mask as an etch template;
increasing a depth of said via opening; and
forming a trench in said dielectric material using said second mask opening as an etch mask.

2. The method of claim 1, wherein increasing a depth of said via opening and forming said trench comprises performing a common etch process.

3. The method of claim 1, wherein forming said first etch mask comprises forming a first mask layer above said dielectric material and patterning said first mask layer on the basis of a first resist mask so as to obtain said first mask opening, wherein said first lateral size is greater than a lateral size of said via opening.

4. The method of claim 3, wherein forming said second etch mask comprises forming a second mask layer above said first etch mask and within said first mask opening and patterning said second mask layer on the basis of a second resist mask so as to define said second mask opening and to form a sidewall spacer on sidewalls of said first mask opening.

5. The method of claim 4, further comprising adjusting a width of said sidewall spacer so as to correspond to a target value of a lateral size of said via opening.

6. The method of claim 1, wherein forming said second mask opening in said first etch mask comprises removing material of said first and second etch masks by performing an anisotropic etch process.

7. The method of claim 6, wherein said first and second etch masks have substantially the same removal rate when performing said anisotropic etch process.

8. The method of claim 7, wherein said first and second etch masks are formed so as to have substantially the same material composition.

9. The method of claim 1, further comprising filling said via opening and said trench with a metal-containing material by performing a common deposition process.

10. The method of claim 9, wherein filling said via opening and said trench with a metal-containing material comprises forming a conductive barrier material on inner surface areas of said via opening and said trench.

11. The method of claim 1, wherein said lateral size of said via opening is approximately 100 nm or less.

12. The method of claim 1, wherein said first etch mask comprises a first dielectric material and said second etch mask comprises a second dielectric material.

13. The method of claim 12, wherein said etch stop layer comprises a third dielectric material that is different from said first and second dielectric materials.

14. A method, comprising:
forming a first etch mask above a dielectric material of a metallization layer of a semiconductor device, said etch mask comprising a first mask opening having a first lateral size;
forming an etch stop liner at least inside of said first mask opening;
forming a spacer element on said etch stop liner and adjacent to sidewalls of said first mask opening so as to adjust a lateral target size of a via opening;
forming at least a portion of said via opening on the basis of said first mask opening having said lateral target size; and
forming a trench in said dielectric material on the basis of a second etch mask so as to connect to said at least a portion of said via opening.

15. The method of claim 14, wherein forming said spacer element comprises depositing a spacer layer and etching said spacer layer so as to define a target width of a bottom of said via opening.

16. The method of claim 15, wherein etching said spacer layer comprises forming a resist mask that defines a lateral size of said trench and etching said spacer layer on the basis of said resist mask.

17. The method of claim 15, wherein said spacer layer is etched prior to forming at least said portion of said via opening.

18. The method of claim 14, wherein forming said trench comprises increasing a depth of said at least a portion of said via opening.

19. The method of claim 16, wherein forming said trench further comprises patterning said first etch mask by using said spacer layer as an etch template so as to obtain said second etch mask after forming said at least a portion of said via opening.

20. A method, comprising:
forming a first etch mask above a dielectric material of a metallization layer of a semiconductor device, said first etch mask comprising a first mask opening;
forming an etch stop layer above said first etch mask and inside of said first mask opening;
after forming said etch stop layer, forming a mask layer above said first etch mask and in said first mask opening;
patterning said mask layer on the basis of a trench mask so as to form a spacer element in said first mask opening and to form a second etch mask from said mask layer that comprises a second mask opening in said mask layer; and
forming a via opening and a trench connected thereto on the basis of said first and second mask openings.

21. The method of claim 20, wherein forming said via opening and said trench comprises forming at least a portion of said via opening on the basis of said first mask opening including said spacer element prior to forming said trench.

22. The method of claim 21, further comprising transferring said second mask opening into said first etch mask and forming said trench on the basis of said first etch mask including said second mask opening.

23. The method of claim 22, wherein forming said trench comprises increasing a depth of said at least a portion of said via opening.

24. The method of claim 20, further comprising filling said via opening and said trench with a metal-containing material by performing a common deposition sequence.

* * * * *